United States Patent
Okamoto et al.

(10) Patent No.: US 7,793,817 B2
(45) Date of Patent: Sep. 14, 2010

(54) ELECTRONIC COMPONENT PLACING APPARATUS AND ELECTRONIC COMPONENT MOUNTING METHOD

(75) Inventors: Kazuo Okamoto, Fukuoka (JP); Syoichi Nishi, Fukuoka (JP); Takeshi Morita, Fukuoka (JP); Masanori Hiyoshi, Fukuoka (JP); Kazuhiko Tomoyasu, Fukuoka (JP)

(73) Assignee: Panasonic Corporation, Osaka (JP)

( * ) Notice: Subject to any disclaimer, the term of this patent is extended or adjusted under 35 U.S.C. 154(b) by 70 days.

(21) Appl. No.: 12/438,099

(22) PCT Filed: Sep. 6, 2007

(86) PCT No.: PCT/JP2007/067779
§ 371 (c)(1),
(2), (4) Date: Feb. 19, 2009

(87) PCT Pub. No.: WO2008/032755
PCT Pub. Date: Mar. 20, 2008

(65) Prior Publication Data
US 2010/0163602 A1    Jul. 1, 2010

(30) Foreign Application Priority Data
Sep. 11, 2006  (JP) .............................. 2006-245227
Sep. 11, 2006  (JP) .............................. 2006-245228

(51) Int. Cl.
*B23K 31/02*    (2006.01)
*B23K 37/00*    (2006.01)

(52) U.S. Cl. ............................. 228/102; 228/8; 228/11; 228/22; 228/41; 228/103; 228/248.1

(58) Field of Classification Search .................... None
See application file for complete search history.

(56) References Cited

U.S. PATENT DOCUMENTS 6,028,673 A * 2/2000 Nagasaki et al. ............ 356/608

(Continued)

FOREIGN PATENT DOCUMENTS

EP    1 445 995 A1    8/2004

(Continued)

OTHER PUBLICATIONS

International Search Report for PCT/JP2007/067779.

*Primary Examiner*—Kiley Stoner
(74) *Attorney, Agent, or Firm*—Pearne & Gordon LLP

(57) ABSTRACT

To provide an electronic component placing apparatus and an electronic component mounting method that can prevent a cold joint from occurring when an electronic component likely to cause warp deformation is mounted by means of soldering. In the electronic component placing apparatus for placing the electronic component 16 with a plurality of solder bumps 16a formed on a lower surface on a board, a film 7a having a film thickness distribution for transferring a desired transfer amount of solder paste according to a state of warp deformation to each of the plurality of solder bumps is formed in a paste transfer unit 24, based on the component warp information indicating the state of warp deformation in a reflow process of the electronic component. Thereby, it is possible to prevent a cold joint from occurring when the electronic component likely to cause warp deformation is mounted by means of soldering by additionally supplying a just enough amount of solder to each solder bump 16a.

4 Claims, 14 Drawing Sheets

U.S. PATENT DOCUMENTS

| | | |
|---|---|---|
| 6,179,196 B1 * | 1/2001 | Heim et al. .................. 228/6.1 |
| 6,531,022 B1 * | 3/2003 | Tsukahara .................. 156/256 |
| 7,387,229 B2 * | 6/2008 | Imanishi et al. ................ 228/8 |
| 2003/0013286 A1 | 1/2003 | Palanisamy et al. |
| 2004/0108368 A1 * | 6/2004 | Onishi et al. ............. 228/248.1 |
| 2005/0161492 A1 | 7/2005 | Yamamoto |
| 2006/0151877 A1 * | 7/2006 | Yamashita et al. ......... 257/737 |
| 2006/0157865 A1 | 7/2006 | Hokari |
| 2006/0208041 A1 * | 9/2006 | MacKay et al. ............. 228/254 |
| 2007/0137559 A1 * | 6/2007 | Kimura et al. .............. 118/256 |
| 2008/0061433 A1 * | 3/2008 | Arquisal et al. ............. 257/737 |
| 2008/0062665 A1 * | 3/2008 | Nakatsuka et al. .......... 361/768 |
| 2008/0085595 A1 * | 4/2008 | Li .............................. 438/612 |

FOREIGN PATENT DOCUMENTS

| | | |
|---|---|---|
| JP | 9-246419 A * | 9/1997 |
| JP | 2000-228576 A * | 8/2000 |
| JP | 2005-305806 A | 11/2005 |
| WO | 99/64882 A1 | 12/1999 |

* cited by examiner

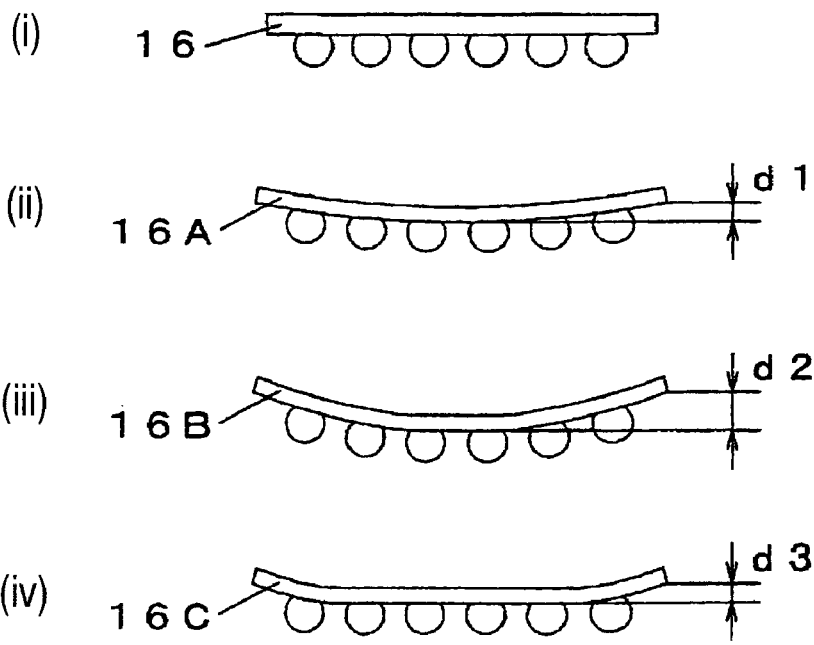
FIG. 7A
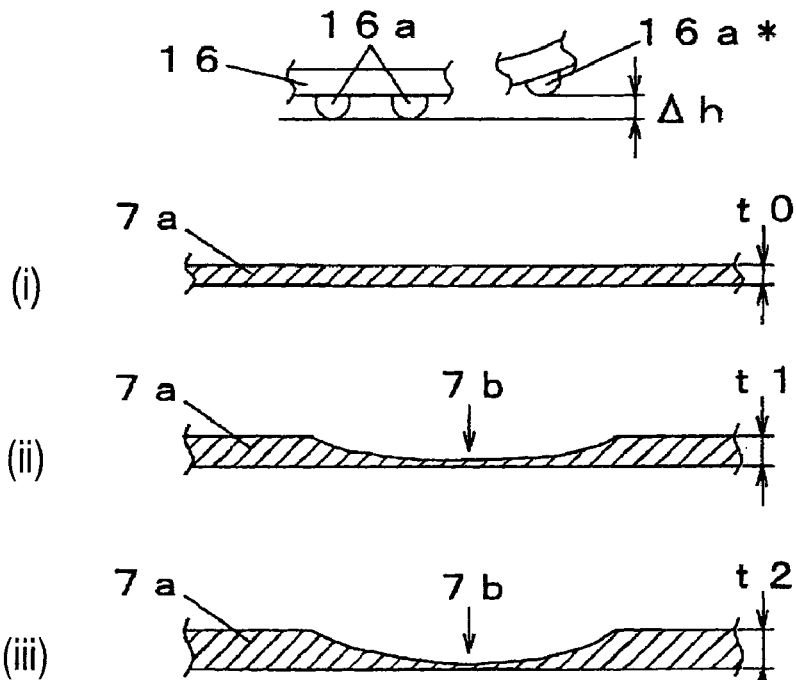
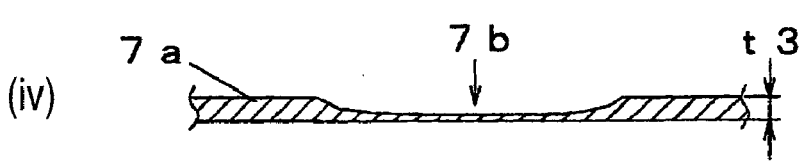
FIG. 7B

FIG. 13A

| COMPONENT DATA | | |
|---|---|---|
| COMPONENT KIND | COMPONENT WARP INFORMATION | PASTE TRANSFER PATTERN |
| A | NO WARP | P1 (EVEN FILM PATTERN) |
| B | UPWARD CURVED WARP (SMALL) | P2 (SMALL CURVED PATTERN) |
| C | UPWARD CURVED WARP (LARGE) | P3 (LARGE CURVED PATTERN) |
| D | END PORTION UPWARD WARP | P4 (END PORTION INCREASED THICKNESS PATTERN) |
| | | |

FIG. 13B

| SQUEEGEE MOVEMENT DATA | |
|---|---|
| PASTE TRANSFER PATTERN | SQUEEGEE MOVEMENT PATTERN |
| P1 | S1 |
| P2 | S2 |
| P3 | S3 |
| P4 | S4 |
| | |

ELECTRONIC COMPONENT PLACING APPARATUS AND ELECTRONIC COMPONENT MOUNTING METHOD

TECHNICAL FIELD

The present invention relates to an electronic component placing apparatus and an electronic component mounting method for placing an electronic component with solder bumps formed on a board and mounting it by means of soldering.

BACKGROUND ART

A method of mounting an electronic component such as a semiconductor device on a circuit board is used in the form of mounting a semiconductor package in which the semiconductor device is mounted on a resin board via solder bumps on the circuit board by means of soldering. In the solder joint for joining the electronic component via solder bumps to the board, the solder bumps are made to land on the electrodes of the board in a state where a solder joint auxiliary agent such as a flux or solder paste is supplied to the solder bumps. Therefore, a device for transferring the flux or solder paste is disposed in the electronic component placing apparatus (e.g., refer to patent document 1).

[Patent document 1] JP-A-2005-305806

Along with the progress of electronic equipment having smaller size and higher functions in recent years, the electronic component built into the electronic equipment is sought for higher mounting density, and has become smaller and thinner. Therefore, the circuit board or the semiconductor package placed on this circuit board has lower rigidity, and is likely to cause warp deformation by heating. Therefore, in a reflow process after placing the semiconductor package with solder bumps formed on the lower surface on the board, the solder bump in a portion where the warp deformation occurs tends to float and cause a gap with the electrode of the board.

The addition of solder paste is effective against the floating of solder bump. However, in a paste film forming device in an example of the above patent document, the solder paste is supplied as a film having uniform thickness to all the solder bumps, whereby the gap between solder bump and electrode may not be covered even by transferring the paste, depending on the extent of floating due to warp deformation. As a result, the solder bumps are not normally joined by soldering with the connecting electrodes on the board, likely producing a cold joint such as faulty electrical continuity or insufficient joint strength.

DISCLOSURE OF INVENTION

Thus, it is an object of the invention to provide an electronic component placing apparatus and an electronic component mounting method that can prevent a cold joint from occurring when an electronic component likely to cause warp deformation is mounted by means of soldering.

According to the present invention, there is provided an electronic component placing apparatus for placing an electronic component with a plurality of solder bumps formed on a lower surface on a board, comprising a component supply section for supplying the electronic component, a board holding section for holding and positioning the board, a placing head for taking the electronic component out of the component supply section and placing the electronic component on the board held in the board holding section, head movement means for moving the placing head between the component supply section and the board holding section, a component warp information storage section for storing the component warp information indicating a state of warp deformation in a reflow process of the electronic component, a paste transfer unit, disposed on a movement path of the placing head, for transferring the solder paste to a plurality of solder bumps by forming a film of solder paste to be transferred to the solder bumps on a film formation face and causing the electronic component held in the placing head to descend to the film formation face, and a control section for controlling the paste transfer unit, characterized in that the paste transfer unit has a squeegee, driven by a squeegee drive section, for performing a film formation operation of combining the horizontal movement and the vertical movement on the film formation face, the control section controls the squeegee drive section based on the component warp information to form the film having a film thickness distribution for transferring a desired transfer amount of solder paste according to the state of warp deformation in the electronic component to each of the plurality of solder bumps.

Also, according to the invention, there is provided an electronic component mounting method for placing and mounting an electronic component with a plurality of solder bumps formed on a lower surface on a board for use in an electronic component placing apparatus comprising a component supply section for supplying the electronic component, a board holding section for holding and positioning the board, a placing head for taking the electronic component out of the component supply section and placing the electronic component on the board held in the board holding section, head movement means for moving the placing head between the component supply section and the board holding section, a component warp information storage section for storing the component warp information indicating a state of warp deformation in a reflow process of the electronic component, a paste transfer unit, disposed on a movement path of the placing head, for forming a film of solder paste to be transferred to the solder bumps on a film formation face with a squeegee that performs a film formation operation of combining the horizontal movement and the vertical movement on the film formation face, and a control section for controlling the paste transfer unit, characterized by including a step of taking the electronic component out of the component supply section with the placing head, a paste transfer step of transferring the solder paste to the solder bumps by causing the electronic component held in the placing head to descend to the film formation face of the paste transfer unit, and a component placing step of placing the electronic component on the board to cause the solder bumps to land via the solder paste on the electrodes of the board, wherein in the film formation operation performed before the paste transfer step, the control section controls a squeegee drive section for driving the squeegee based on the component warp information to form the film having a film thickness distribution for transferring a desired transfer amount of solder paste according to the state of warp deformation in the electronic component to each of the plurality of solder bumps.

With the invention, in the film formation operation performed before the paste transfer step of supplying the solder paste to the solder bumps, it is possible to prevent a cold joint from occurring when the electronic component likely to cause warp deformation is mounted by means of soldering by forming a film having a film thickness distribution for transferring a desired transfer amount of solder paste according to the state of warp deformation in the reflow process of the electronic component to each of the plurality of solder bumps.

BRIEF DESCRIPTION OF DRAWINGS

FIGS. 7A and 7B are explanatory views for explaining the component warp information and squeegee movement data in an electronic component mounting method according to one embodiment of the invention.

FIGS. 13A and 13B are views each showing the data organization of a paste transfer information library in the electronic component placing apparatus according to another embodiment of the invention.

BEST MODE FOR CARRYING OUT THE INVENTION

The embodiments of the present invention will be described below with reference to the drawings.

Figure 1:
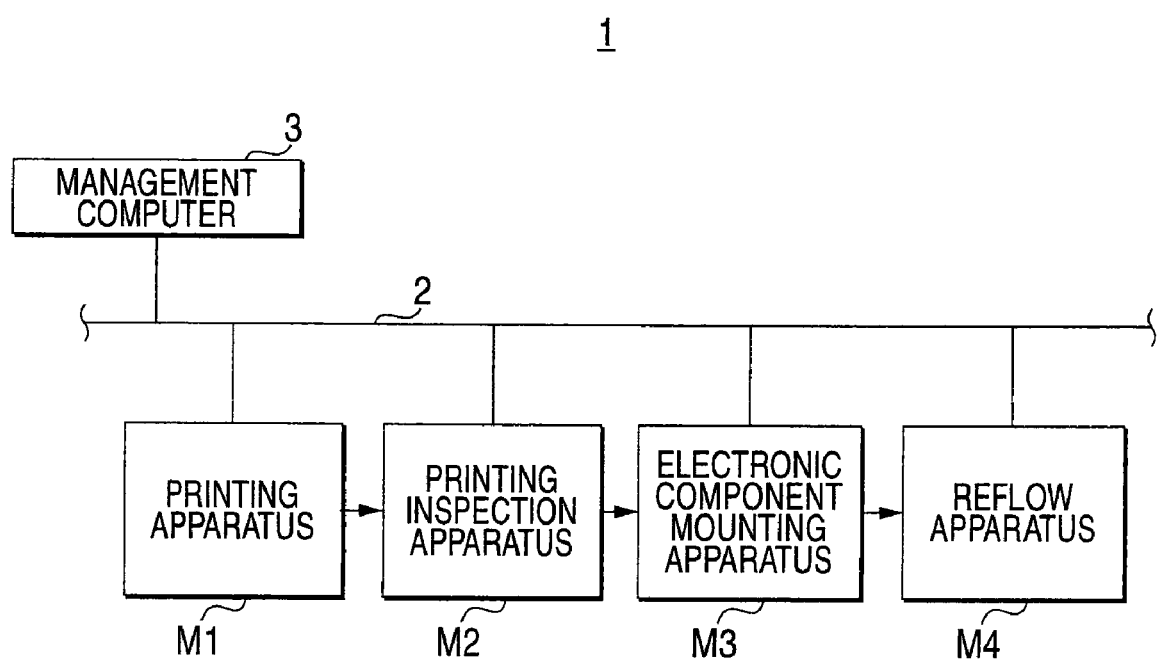
FIG. 1 is a block diagram showing the configuration of an electronic component mounting system according to one embodiment of the present invention.

Referring to FIG. 1, first of all, an electronic component mounting system will be described below. In FIG. 1, the electronic component mounting system has an electronic component mounting line 1 connected via a communication network 2, the electronic mounting line composed of a printing apparatus M1, a printing inspection apparatus M2, an electronic component placing apparatus M3 and a reflow apparatus M4, each of which is an electronic component mounting apparatus, and is totally controlled by a management computer 3. In this embodiment, with these plurality of electronic component mounting apparatuses, an electronic component with a plurality of solder bumps for connection to the outside formed on a lower surface is mounted on a board by means of soldering to manufacture a mounted board. The electronic component mounting apparatuses may be connected via the communication network 2 without using the management computer 3.

The printing apparatus M1 screen-prints the solder paste for joining the electronic component to the electrodes formed corresponding to an array of solder bumps of the electronic component on the board of mounting object. The printing inspection apparatus M2 inspects a printed state by recognizing the plane position of solder paste printed by picking up an image of the board after solder printing. The electronic component placing apparatus M3 places the electronic component on the board where the solder paste is printed, using a placing head. The reflow apparatus M4 solders the electronic component to the board by heating the board on which the electronic component is placed and fusing the solder bumps and the solder paste due to heat.

Figure 2:
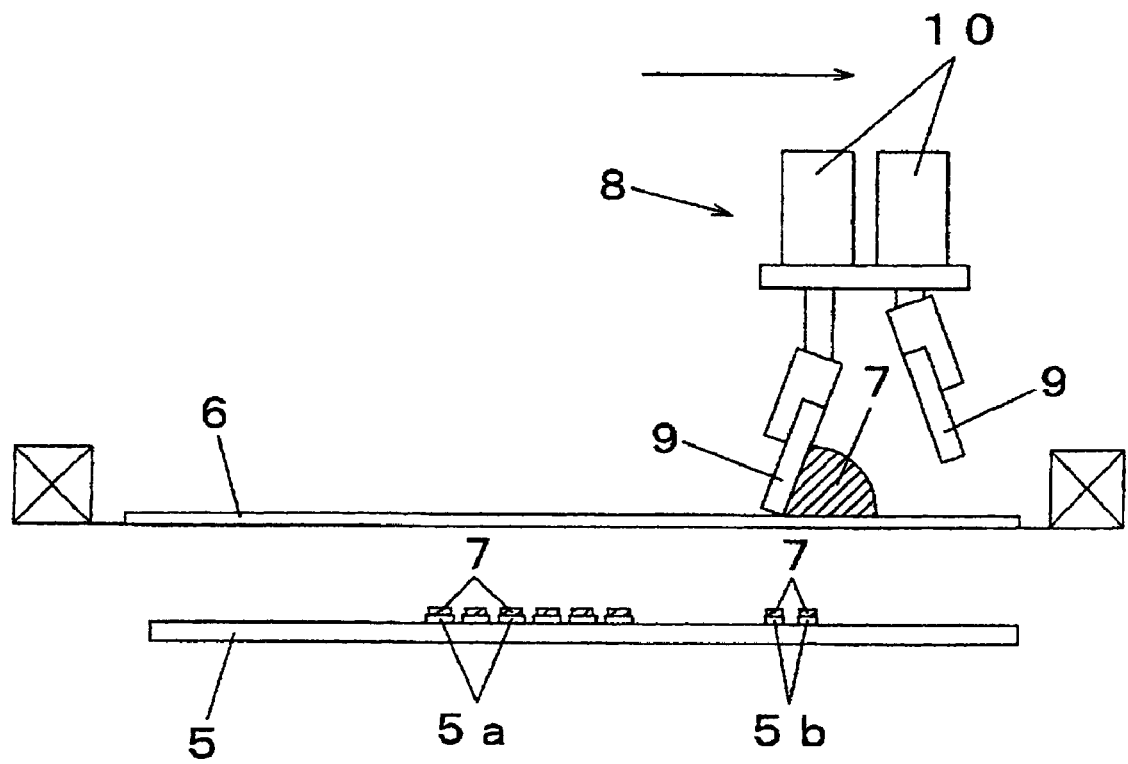
FIG. 2 is an explanatory view for explaining the solder printing in the electronic component mounting system according to one embodiment of the invention.

FIG. 2 shows the solder printing made in the printing apparatus M1. The printing apparatus M1 comprises a screen mask 6 and a squeegee mechanism 8. The board 5 on which the electronic component is mounted is positioned and held under the screen mask 6 by a board holding section (not shown). The electrodes 5a and 5b, to which the electronic component of mounting object is connected, are provided on the upper surface of the board 5. The squeegee mechanism 8 in which two printing squeegees 9 can be moved up or down by the lift mechanisms 10 is disposed above the screen mask 6. The squeegee mechanism 8 is movable horizontally by a horizontal movement mechanism (not shown). The solder paste 7 is printed on the electrodes 5a and 5b via the pattern holes (not shown) punched in the screen mask 6 by horizontally moving the squeegee mechanism 8 while sliding the printing squeegee 9 with the upper surface of the screen mask 6 in a state where the board 5 is contacted with the lower surface of the screen mask 6 and the solder paste 7 is supplied onto the upper surface of the screen mask 6.

Figure 3:
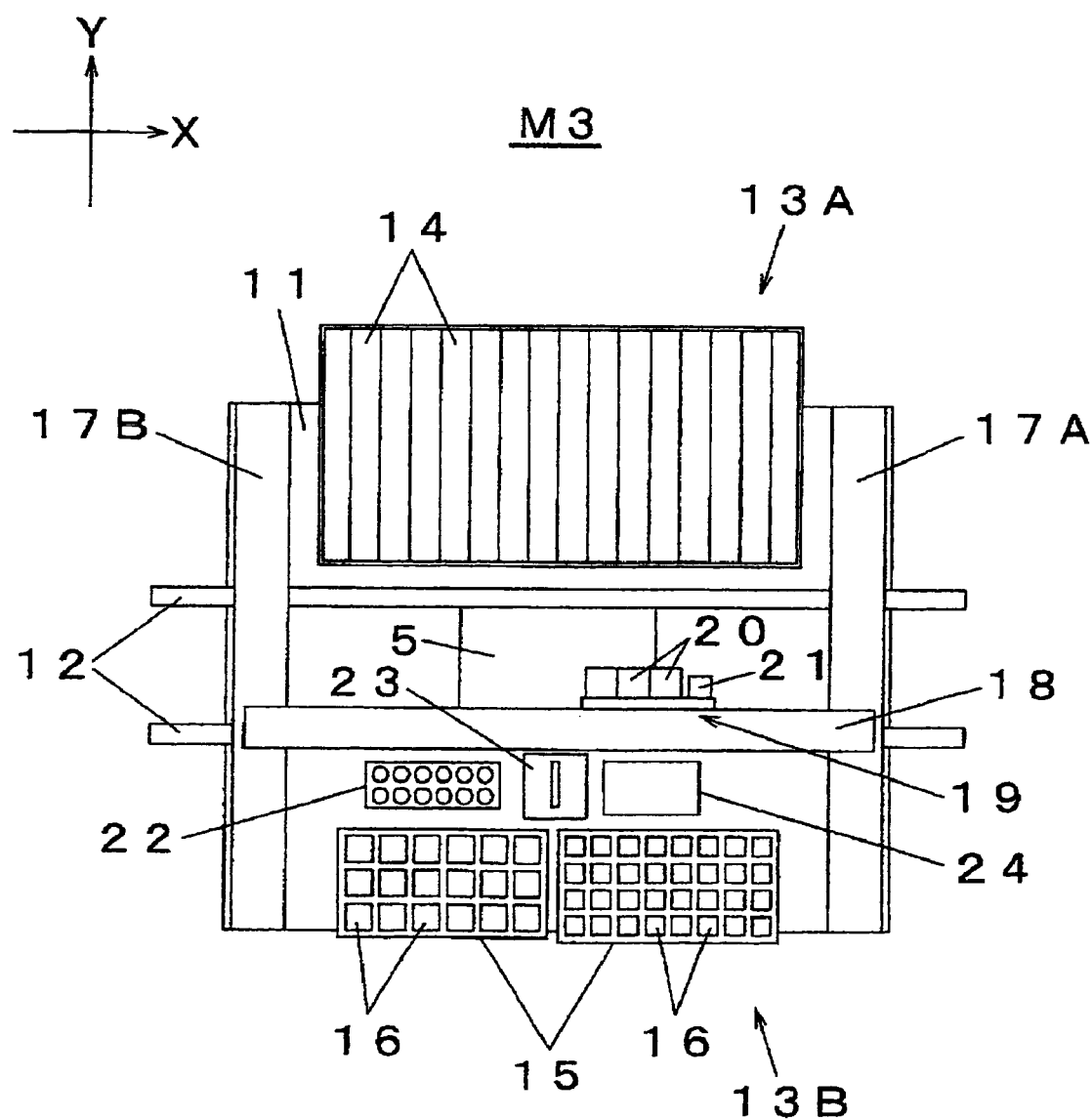
FIG. 3 is a plan view of an electronic component placing apparatus according to one embodiment of the invention.

Referring now to FIG. 3, the structure of the electronic component placing apparatus M3 will be described below. In FIG. 3, the conveying paths 12 extend in the X direction (board conveying direction) in the central portion of a base 11. The conveying paths 12 convey the board 5 on which the electronic component is mounted and hold and position the board 5 at the electronic component mounting position. Accordingly, the conveying paths 12 serve as the board holding section for holding and positioning the board 5. A first component supply section 13A and a second component supply section 13B, which supply the electronic component, are disposed on both sides of the conveying paths 12.

A plurality of tape feeders 14 are disposed in the first component supply section 13A. The tape feeders feed by pitch a tape holding the electronic component such as a terminal chip type component, and supply the electronic component to a pickup position of the placing head, as will be described in the following. Two tray feeders 15 are disposed in parallel in the second component supply section 13B. The two tray feeders 15 supply the electronic components 16 of different kinds to the pickup positions of the placing head in grid array. The electronic components 16 include a semiconductor package in which the semiconductor device is mounted on the resin board of thin type such as BGA and a small component with bump. In this embodiment, the electronic component 16 is connected with the board via a plurality of solder bumps formed on the lower surface, such as the semiconductor package.

A Y axis table 17A and a Y axis guide 17B are disposed on both end portions of the base 11 in the X direction. An X axis table 18 is installed between the Y axis table 17A and the Y axis guide 17B. Further, a placing head 19 is attached on the X axis table 18. The placing head 19 is the multiple type having a plurality of unit placing heads 20, and moved integrally with a board recognition camera 21.

The placing head 19 is moved in the XY direction by driving the X axis table 18 and the Y axis table 17A. The electronic component is taken out of the first component supply section 13A and the second component supply section 13B by an adsorption nozzle 20a (see FIG. 9) of the unit placing head 20, and placed on the board 5 positioned and held on the conveying paths 12. The X axis table 18 and the Y axis table 17A constitute head movement means for moving the placing head 19 between the first component supply section 13A and the second component supply section 13B and the conveying paths 12.

A line camera 23, a nozzle stocker 22 and a paste transfer unit 24 are disposed on the movement path of the placing head 19 between the conveying paths 12 and the second component supply section 13B. When the placing head 19 picking up the electronic component from each component supply section passes above the line camera 23 on the way to the board 5, the electronic component held in the placing head 19 is recognized.

The nozzle stocker 22 accommodates plural kinds of adsorption nozzle in accordance with the kind of electronic component placed on the board 5. When the placing head 19 makes access to the nozzle stocker 22, the adsorption nozzle according to the electronic component to be placed is selected and attached. The paste transfer unit 24 has a function of forming a thin film of solder paste made viscous by mixing solder components into flux on the film formation face. By causing the electronic component held in the placing head 19 to descend to the film formation face of the paste transfer unit 24, the solder paste is transferred and supplied to plural solder bumps formed on the lower surface of the electronic component. The transfer and supply of the solder paste is intended to improve the reliability of solder joint by adding the amount of solder in soldering the solder bumps with the electrodes of the board 5.

Figure 4:
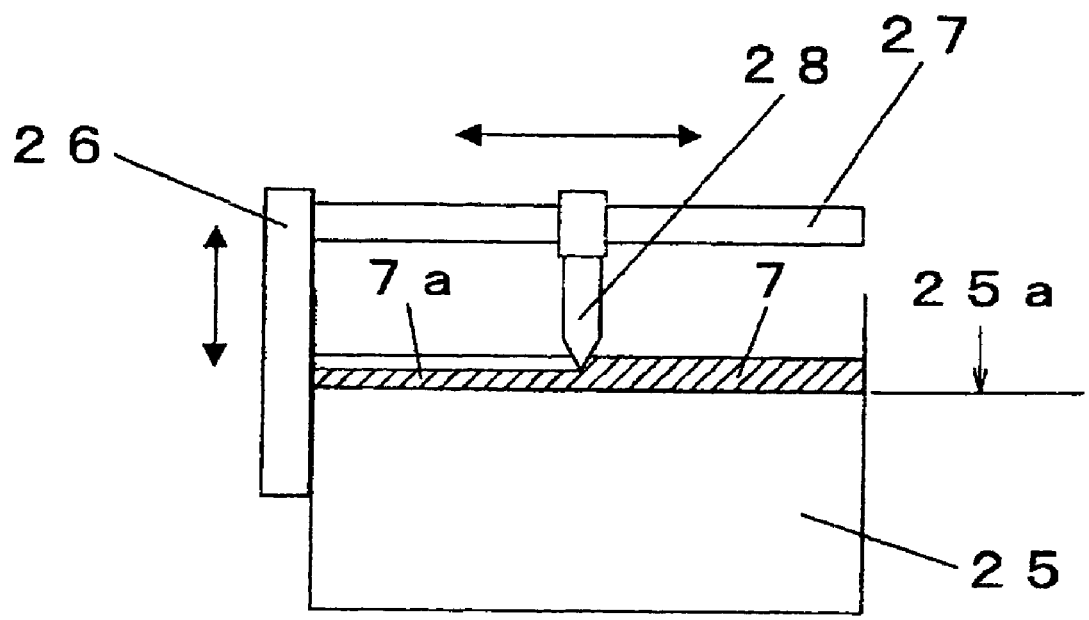
FIG. 4 is an explanatory view for explaining the structure of a paste transfer unit in the electronic component placing apparatus according to one embodiment of the invention.

Referring to FIG. 4, the constitution of the paste transfer unit 24 provided in the electronic component placing apparatus M3 will be described below. In FIG. 4, a smooth film formation face 25a is provided on the upper surface of a base portion 25. A film 7a of the solder paste 7 to be transferred and supplied to the solder bumps 16a formed on the electronic component 16 is formed on the film formation face 25a through a film formation operation for spreading the solder paste 7 by a squeegee 28.

The base portion 25 is provided with a vertical movement mechanism 26 and a horizontal movement mechanism 27 for allowing the squeegee 28 to make the film formation operation. The squeegee 28 is attached on the horizontal movement mechanism 27. The vertical movement mechanism 26, the horizontal movement mechanism 27 and the squeegee 28 are driven by a squeegee drive section 35 (see FIG. 6). That is, the squeegee 28 is moved horizontally by driving the horizontal movement mechanism 27, and further moved up or down integrally with the horizontal movement mechanism 27 by driving the vertical movement mechanism 26. Accordingly, the squeegee 28 is driven by the squeegee drive section 35 to perform the film formation operation of combining the horizontal movement and the vertical movement on the film formation face 25a. Thereby, the film of the solder paste 7 is formed on the film formation face 25a.

Figure 5A:
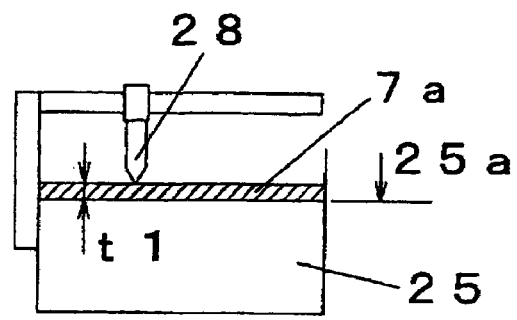
FIGS. 5A to 5D are explanatory views for explaining the operation of the paste transfer unit in the electronic component placing apparatus according to one embodiment of the invention.
Figure 5B:
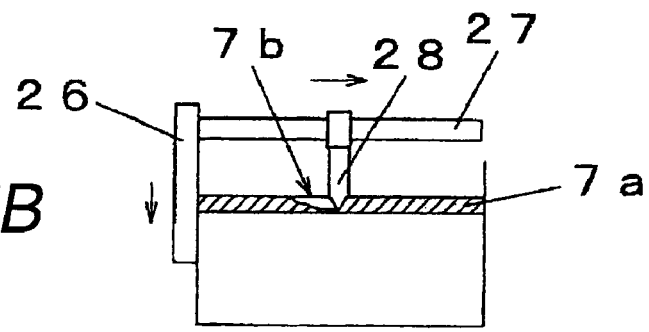
Figure 5C:
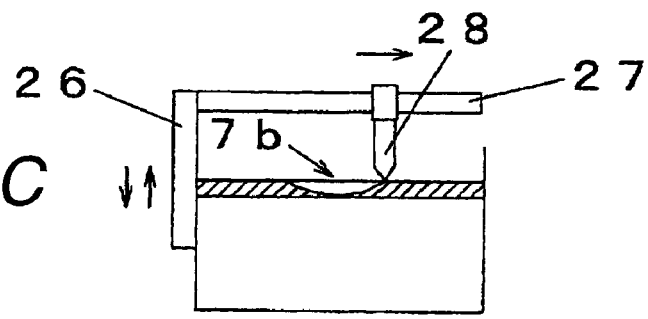
Figure 5D:
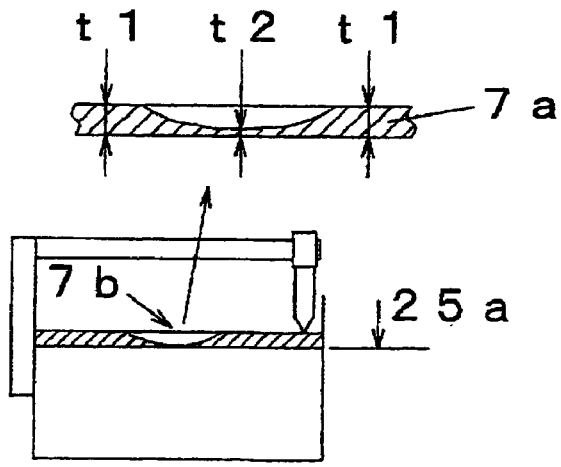

FIGS. 5A to 5D show one pattern example of the film formation operation by the squeegee 28. FIG. 5A shows a state where the film 7a having uniform film thickness is formed on the film formation face 25a by spreading the solder paste 7 in initial film thickness t1 on the upper surface of the film formation face 25a with the squeegee 28. Thereafter, the film formation operation for acquiring a desired film thickness distribution is started. That is, a film thickness change section 7b in the shape in which the solder paste 7 is scraped in a desired cross-section is formed in a predetermined range of the film 7a by causing the squeegee 28 to perform the film formation operation of combining the horizontal movement and the vertical movement in a predetermined pattern with the vertical movement mechanism 26 and the horizontal movement mechanism 27, as shown in FIGS. 5B and 5C. This film thickness change section 7b has a film thickness distribution in which the film thickness in the central portion is t2 and the film thickness in the peripheral portion is t1 in an example as shown in FIG. 5D. The paste transfer unit 24 can form the film 7a with any film thickness distribution by changing the pattern of the film formation operation with the squeegee 28.

Figure 6:
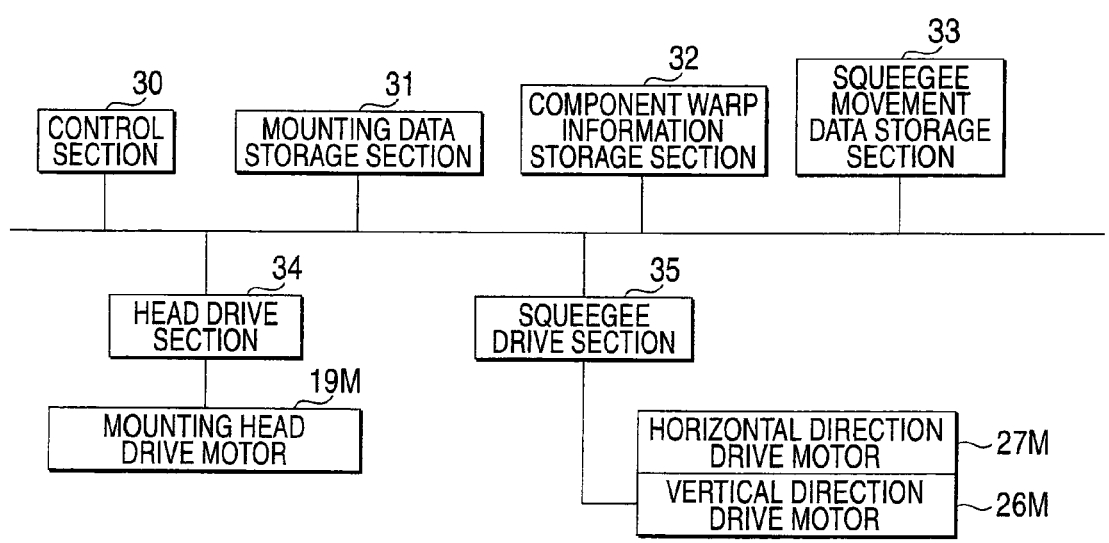
FIG. 6 is a block diagram showing the configuration of a control system in the electronic component placing apparatus according to one embodiment of the invention.

Referring to FIG. 6, the configuration of the control system will be described below. The control section 30 is the overall control section having a CPU and controls the operation or process of each section as described below. A placing data storage section 31 stores data required for controlling the placing operation with the placing head 19, such as mounting data. A component warp information storage section 32 stores data regarding a state of warp deformation in the reflow process of the electronic component of object. A squeegee movement data storage section 33 stores the pattern of the film formation operation performed by moving the squeegee 28, namely, the operation pattern of combining the horizontal and vertical movement of the squeegee 28, corresponding to the component warp information. A head drive section 34 drives a placing head drive motor 19M for moving the placing head 19. A squeegee drive section 35 drives a vertical direction drive motor 26M and a horizontal direction drive motor 27M that are drive sources of the vertical movement mechanism 26 and the horizontal movement mechanism 27.

Referring to FIGS. 7A and 7B, the component warp information and the squeegee movement data will be described below. The semiconductor package that is principally composed of a resin board of thin type such as BGA, like the electronic component 16 of this embodiment, has a characteristic that it is likely to deform, and particularly easily subjected to warp deformation by heating in the reflow process. That is, the electronic component 16 is flat as a whole at the ordinary temperatures, as shown at (i) in FIG. 7A, but may be subjected to upper warp deformation at both end portions by heating. At this time, the different deformation behaviors may occur depending on various factors, such as the plane size, thickness, and board configuration of the electronic component 16, namely, resin material and internal wiring condition, as illustrated at (ii), (iii) and (iv) in FIG. 7A.

The electronic component 16A as shown at (ii) has a deformation characteristic that the warp deformation is relatively small and both end portions are deformed upward only by a small deformation amount d1, and the electronic component 16B as shown at (iii) has a deformation characteristic that the warp deformation is large and both end portions are deformed upward by a deformation amount d2 greater than d1. Also, the electronic component 16C as shown at (iv) has a deformation characteristic that the deformation in the central portion is small and only both end portions are raised locally by a deformation amount d3.

This warp deformation defers in various ways, depending on the kind of component, as previously described. The warp direction may be opposite to the direction as shown in FIG. 7A. That is, there is a deformation behavior in some cases that the electronic component is raised in the central portion relatively from both end portions, and convex upward as a whole. The component warp information is obtained by actually measuring the deformation amount every time of heating the electronic component of object under the same heating condition as in the reflow process, and written in the component warp information storage section 32. When this information is already obtained as known data, it is written via the communication network 2 into the component warp information storage section 32 by the management computer 3.

Thus, when the electronic component exhibits the warp deformation behavior in the reflow process, the solder bumps formed on the lower surface are displaced in the direction away from the electrodes of the board, so that the molten solder in which the solder paste printed on the electrode of the board is fused and the molten solder in which the solder bump is fused are not integrated during the solder fusing in the reflow process, resulting in a so-called "solder open" to impede the normal solder connection in some cases.

To prevent such a cold joint, in this embodiment, the solder paste 7 is additionally transferred and supplied to the solder bumps 16a, depending on the extent of component warp deformation by heating in the reflow process, namely, the extent that the solder bumps 16a are displaced in the direction away from the electrodes 5a to prevent occurrence of the "solder open". This additional supply of the solder paste 7 is performed by causing the electronic component 16 held in the unit placing head 20 to descend to the film 7a formed by the paste transfer unit 24 to make the solder bumps 16a contact with the film 7a.

At this time, a proper amount of the solder paste 7 required for preventing the "solder open" is transferred and supplied to each solder bump 16a. That is, a film thickness distribution of the film 7a formed on the film formation face 25a is set up by the film formation operation of the squeegee 28 in accordance with a height difference Δh between the solder bump 16a\* displaced by warp deformation and the average solder bump 16, as shown in FIG. 7B. The squeegee movement data represents a pattern of the film formation operation by the squeegee 28 to form the film 7a having such film thickness distribution. If the component warp information is written into the component warp information storage section 32, it is also written into the squeegee movement data storage section 33 simultaneously.

For example, the electronic component 16 having less warp deformation, like the electronic component 16 as shown at (i) in FIG. 7A, is formed with the even film 7a having the overall film thickness t0, as shown at (i) in FIG. 7B, so that a desired supply amount of the solder paste 7 may be transferred evenly to each solder bump 16a. On the contrary, the electronic component exhibiting warp deformation in a totally curved state, like the electronic components 16A and 16B as shown at (ii) and (iii) in FIG. 7A, is firstly formed with the film 7a having the overall film thickness t1, t2 according to the warp extent, namely, the displacement amount d1, d2 at both end portions, is firstly formed, and then formed with the film thickness change section 7b according to the totally curved state as shown at (ii) and (iii) in FIG. 7B, so that the film thickness distribution may accord with the height difference Δh between each solder bump 16a. Further, the electronic component having small deformation in the central portion and local warp deformation only at both end portions, like the electronic component 16C as shown at (iv) in FIG. 7A, is formed with the film 7a having the overall film thickness t3 according to the displacement amount d3, and then formed with the film thickness change section 7b according to the deformation state, as shown at (iv) in FIG. 7B.

Referring to a flowchart of FIG. 8, an electronic component mounting method for use in this electronic component mounting system will be described below. This electronic component mounting method involves placing the electronic component 16 formed with a plurality of solder bumps 16a on the lower surface on the board 5, and mounting it. First of all, the electronic component 16 is taken out of the second component supply section 13B by the placing head 19 (ST1).

Figure 9A:
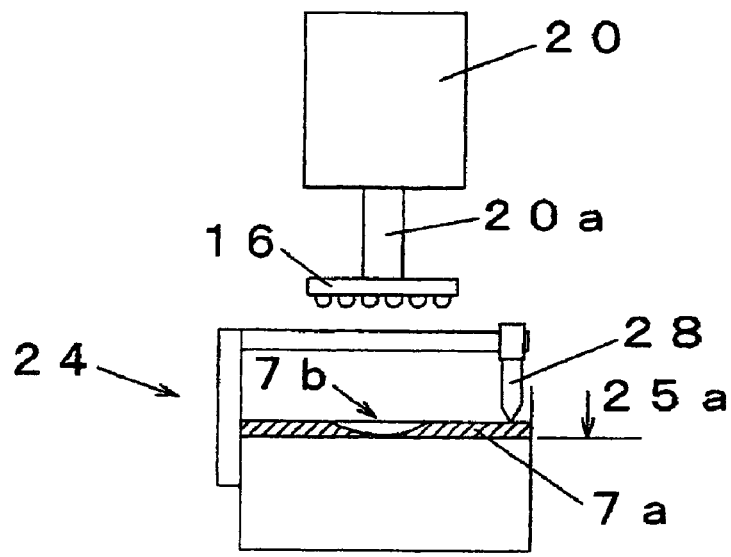
FIGS. 9A to 9C are explanatory views each showing the process of the electronic component mounting method according to one embodiment of the invention.
Figure 9B:
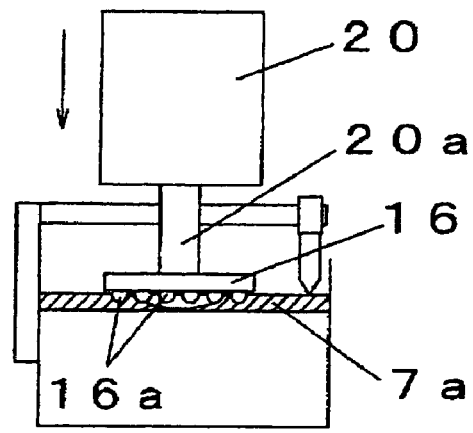
Figure 9C:
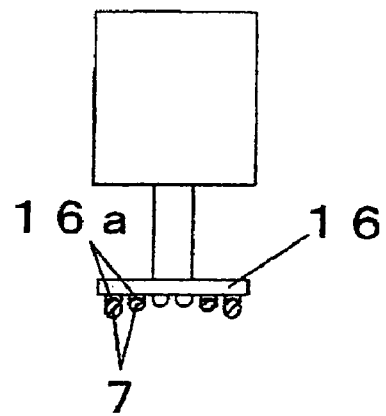

The solder paste 7 is transferred to the solder bumps 16a by causing the electronic component 16 held in the placing head 19 to descend to the film formation face 25a of the paste transfer unit 24 (paste transfer process) (ST2), as shown in FIG. 9A. That is, each solder bump 16a is contacted with the film 7a by causing the electronic component 16 held in the unit placing head 20 to descend to the film 7a, as shown in FIG. 9B, so that a desired transfer amount of the solder paste 7 is transferred to each solder bump 16a of the electronic component 16, as shown in FIG. 9C.

In the film formation operation performed before this paste transfer process, the component warp information stored in the component warp information storage section 32 is read in accordance with the kind of electronic component to be mounted, and the squeegee movement data corresponding to this component warp information is further read from the squeegee movement data storage section 33. And the control section 30 controls the squeegee drive section 35 based on this squeegee movement information to drive the squeegee 28 to perform the film formation operation for forming the film having a film thickness distribution to transfer a desired transfer amount of the solder paste 7 according to the warp deformation of the electronic component to each of plural solder bumps 16a (see FIG. 5).

Thereby, the film thickness change section 7b in the shape based on the component warp information of the electronic component 16 is formed on the film 7a. That is, the control section 30 controls the squeegee drive section 35 for driving the squeegee 28 based on the component warp information to form the film 7a having a film thickness distribution for transferring a desired transfer amount of solder paste according to the state of warp deformation of the electronic component to each of plural solder bumps 16a.

Figure 10A:
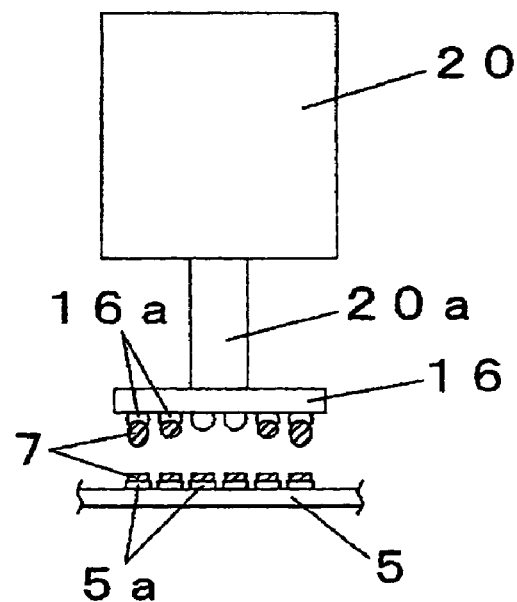
FIGS. 10A to 10C are explanatory views each showing the process of the electronic component mounting method according to one embodiment of the invention.
Figure 10B:
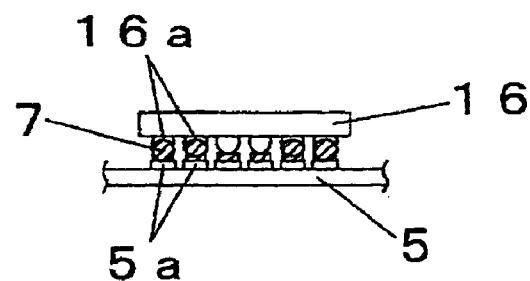

The electronic component 16 is placed on the board 5 (ST3). That is, the placing head 19 is moved to locate the unit placing head 20 holding the electronic component 16 after transfer of the solder paste 7 on the board 5 to align the solder bumps 16a with the electrodes 5a of the board 5, as shown in FIG. 10A. Then, the electronic component 16 is caused to descend and placed on the board 5 to cause the solder bumps 16a to land on the electrodes 5a of the board 5 via the solder paste 7, as shown in FIG. 10B (component placing process).

Figure 10C:
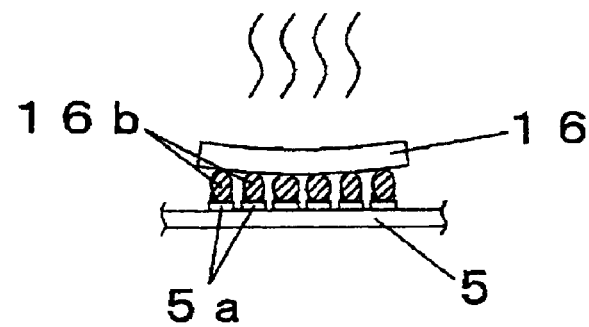

Thereafter, the board 5 with the electronic component 16 placed is carried into the reflow apparatus M4. And the board 5 is heated, together with the electronic component 16, up to the solder melting temperature or more, to melt the solder components in the solder bumps 16a and the solder paste 7 and join by soldering the electronic component 16 with the board 5, as shown in FIG. 10C (reflow process) (ST4). At this time, the electronic component 16 undergoes a thermal deformation, and has a deformation behavior of being warped upward in the outer edge portion, whereby the solder bumps 16a located in the outer edge portion are displaced together with the electronic component 16 to increase the gap with the electrodes 5a.

Even in this case, the desired transfer amount of solder paste 7 is additionally transferred and supplied to each solder bump 16a, based on the component warp information of the electronic component 16, whereby the solder amount for soldering the solder bumps 16a and the electrodes 5a is less insufficient in the portion where the gap between the electrodes 5a and the solder bumps increase due to warp deformation. That is, the solder component in which the solder bumps 16a of the electronic component 16 are fused, together with the solder component in which the solder in the solder paste 7 is fused, normally connects all the solder bumps 16a with the electrodes 5a, so that the solder joints 16b electrically connecting the electronic component 16 with the electrodes 5a are excellently formed without causing a cold joint such as a faulty electrical continuity or shortage of junction strength, as show in FIG. 10C.

Figure 11A:
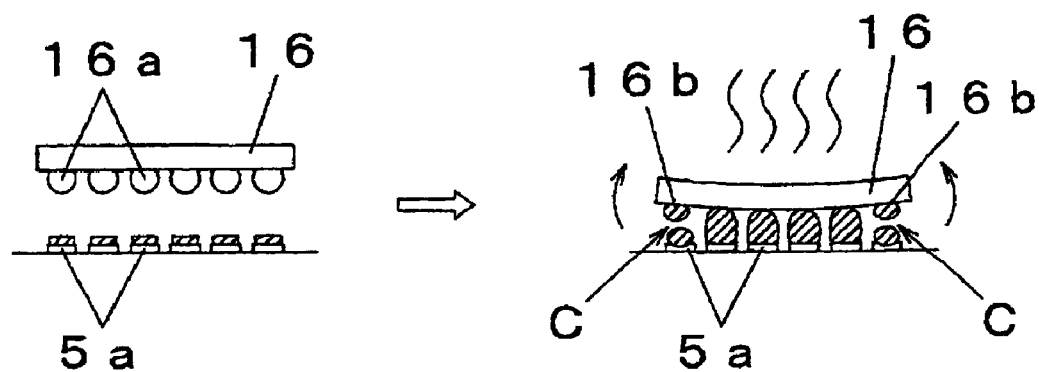
FIGS. 11A and 11B are explanatory views each showing the relationship between the transfer amount of solder paste and the solder cold joint in the electronic component mounting method according to one embodiment of the invention.
Figure 11B:
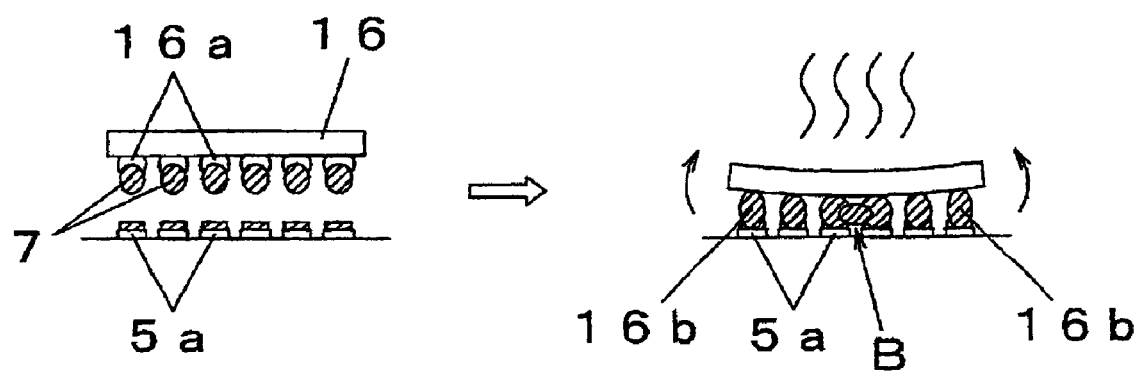

FIGS. 11A and 11B show an example of cold joint that is likely to occur when the semiconductor package of thin type is mounted by means of soldering. FIG. 11A shows an example of placing the electronic component 16 which is likely to warp upward at both end portions in this reflow process without additionally supplying the solder paste 7. In this case, when a warp deformation occurs in the reflow process, the solder bumps 16a located in the central portion are excellently soldered with the electrodes 5a of the board, but the amount of solder paste 7 may be insufficient at the positions of the solder bumps 16a near both end portions. As a result, the solder joints 16b to completely connect the electronic component 16 and the electrodes 5a is not soundly formed, resulting in a cold joint with unjoined portions C.

Also, FIG. 11B shows an example in which the same transfer amount of solder paste 7 is additionally supplied to each solder bump 16a for this electronic component 16. In this case, when a warp deformation occurs in the reflow process, the solder joints are excellently made at the positions of the solder bumps 16a near both end portions, because the amount of solder paste 7 becomes proper by addition, but the amount of solder paste 7 is more excessive than the proper amount for the solder bumps 16a located in the central portion. As a result, excessive solder in molten state flows in this range, producing a solder bridge B in which the adjacent electrodes 5a are mutually connected by solder.

On the contrary, in the electronic component mounting method of this embodiment, the desired transfer amount of solder paste 7 in accordance with the state of warp deformation of the electronic component is transferred to each of plural solder bumps, based on the component warp information stored according to the kind of electronic component, as previously described, whereby the amount of solder paste 7 is just enough for each solder bump 16a in the reflow process. Thereby, it is possible to prevent the cold joint from occurring when the semiconductor package of thin type likely to cause warp deformation in the reflow process is mounted on the board by means of soldering.

Figure 12:
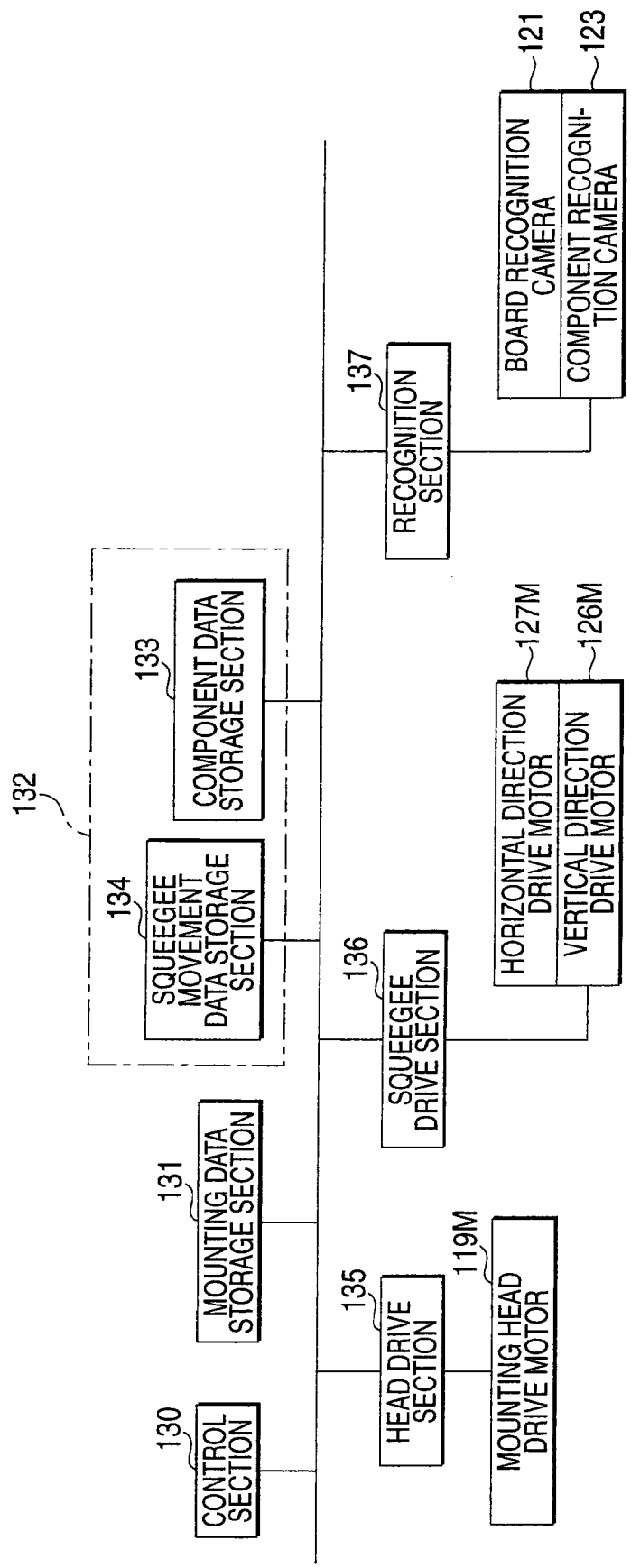
FIG. 12 is a block diagram showing the configuration of a control system in an electronic component placing apparatus according to another embodiment of the invention.

Another embodiment of the invention will be described below. Referring to FIG. 12, the configuration of a control system will be described below. The control section 130 is the overall control section having a CPU and controls the operation or process of each section as described below. A placing data storage section 131 stores data required for controlling the placing operation with the placing head 19, such as mounting data. A component data storage section 133 and a squeegee movement data storage section 134 make up a paste transfer information library 132 for storing the paste transfer information for controlling the film formation operation performed in the paste transfer unit 24 for each kind of electronic component.

A head drive section 135 drives a placing head drive motor 119M for moving the placing head 19. A squeegee drive section 136 drives a vertical direction drive motor 126M and a horizontal direction drive motor 127M that are drive sources of a vertical movement mechanism 126 and a horizontal movement mechanism 127. A recognition section 137 makes the recognition processing for image data acquired by a board recognition camera 121 and a component recognition camera 123 to recognize the position of the board 5 and identify the electronic component 16 and detect the position of the electronic component in a state where it is held in the placing head 19.

Referring to FIGS. 13A and 13B, the data organization of the paste transfer information library 132 will be described below. FIG. 13A shows the component data stored in the component data storage section 133, in which the component warp information 133a and a paste transfer pattern 133b are stored for each component kind A, B, C, D, . . . . The component warp information 133a indicates the state of warp deformation in the reflow process of the electronic component, and the paste transfer pattern 133b indicates a film thickness distribution for transferring a desired transfer amount of solder paste according to the state of warp deformation to a plurality of solder bumps.

And the squeegee movement data storage section 134 stores a squeegee movement pattern 134a linked with the paste transfer pattern 133b, as shown in FIG. 13B. The squeegee movement pattern 134a is data of operation pattern for causing the squeegee 28 to perform the film formation operation of combining the horizontal movement and the vertical movement on the film formation face 25a in the paste transfer unit 24 to implement the film thickness distribution indicated by the paste transfer pattern 133b. The component warp information 133a, the paste transfer pattern 133b and the squeegee movement pattern 134a constitute the paste transfer information.

Figure 8:
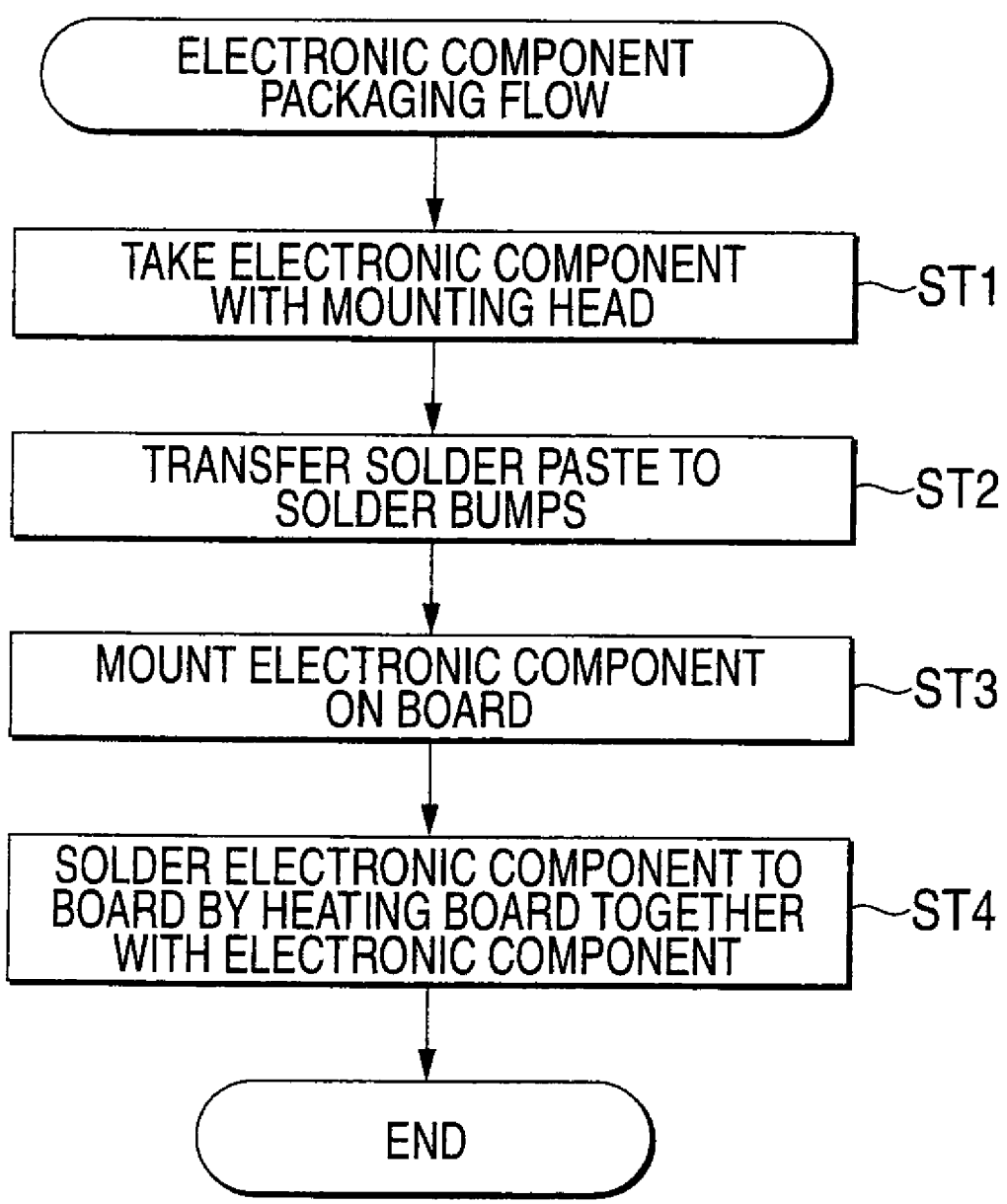
FIG. 8 is a flowchart showing the electronic component mounting method according to one embodiment of the invention.

Referring to FIG. 8, a specific example of the component warp information 133a will be described below. The semiconductor package that is principally composed of a resin board of thin type such as BGA, like the electronic component 16 of this embodiment, has a characteristic that it is likely to deform, and particularly easily subjected to warp deformation by heating in the reflow process. And this tendency of warp deformation is not uniform, but different deformation behaviors may arise, depending on various factors, such as the plane size, thickness, and board configuration of the electronic component 16, namely, resin material and internal wiring condition, as illustrated in the following.

That is, the electronic component 16A (component kind A) as shown at (i) in FIG. 8A has a characteristic that it is almost flat as a whole and the warp deformation is not caused, in which the component warp information 133a is specified as "no warp".

The electronic component 16B (component kind B) as shown at (ii) in FIG. 8A has a characteristic that it is subjected to warp deformation in the almost totally curved shape in the form in which the warp deformation is relatively small, and both end portions are displaced upward only by a small deformation amount d1, and the electronic component 16C (component kind C) as shown at (iii) in FIG. 8A has a characteristic that it is likewise subjected to warp deformation in the almost totally curved shape in the form in which the warp deformation is large and both end portions are displaced upward by a deformation amount d2 greater than d1. The component warp information 133a of these component kinds B and C are specified as "upward curved warp (small)" and "upward curved warp (large)", respectively. Also, the electronic component 16D as shown at (iv) in FIG. 8A has a deformation characteristic that the deformation in the central portion is small and only both end portions are raised locally by a deformation amount d3, in which the component warp information 133a is specified as "end portion upward warp".

This warp deformation defers in various ways, depending on the kind of component as previously described. The warp direction may be opposite to the direction as shown in FIG. 8A. That is, there is a deformation behavior in some cases that the electronic component is raised in the central portion relatively from both end portions, and convex upward as a whole. The component warp information is obtained by actually measuring the deformation amount by heating a plurality of electronic components of objects under the same heating condition as in the reflow process. The obtained data is collected as the library data, and written in the paste transfer information library 132 directly from the operator panel by the electronic component placing apparatus M3, or via the communication network 2 by the management computer 3.

The paste transfer pattern 133b stored and linked with the component warp information 133a will be described below. When the electronic component exhibits the warp deformation behavior in the reflow process, the solder bumps formed on the lower surface are displaced in the direction away from the electrodes of the board, so that the molten solder in which the solder paste printed on the electrode of the board is fused and the molten solder in which the solder bump is fused are not integrated during the solder fusing in the reflow process, resulting in a so-called "solder open" to impede the normal solder connection in some cases.

To prevent such a cold joint, in this embodiment, the solder paste 7 is additionally transferred and supplied to the solder bumps 16a, depending on the extent of component warp deformation by heating in the reflow process, namely, the extent that the solder bumps 16a are displaced in the direction away from the electrodes 5a to prevent occurrence of the "solder open". This additional supply of the solder paste 7 is performed by causing the electronic component 16 held in the unit placing head 20 to descend to the film 7a formed by the paste transfer unit 24 to make the solder bumps 16a contact with the film 7a.

At this time, a proper amount of the solder paste 7 required for preventing the "solder open" is transferred and supplied to each solder bump 16a. That is, a film thickness distribution of the film 7a formed on the film formation face 25a is set up in accordance with a height difference Δh between the solder bump 16a* displaced by warp deformation and the average solder bump 16, as shown in FIG. 8B. The paste transfer pattern 33b specifies such a pattern of film formation distribution.

For example, the electronic component 16 having less warp deformation, like the electronic component 16A as shown at (i) in FIG. 8A, transfers a desired supply amountpace of solder paste 7 evenly to the solder bumps 16a. That is, the paste transfer pattern P1 (even film pattern) for transferring the paste with the even film 7a having the overall film thickness t0 is set up, as shown at (i) in FIG. 8B, and stored and linked with the component kind A in the component data storage section 33.

On the contrary, the electronic component exhibiting warp deformation in a totally curved state, like the electronic components 16B and 16C as shown at (ii) and (iii) in FIG. 8A, is firstly formed with the film 7a having the overall film thickness t1, t2 according to the warp extent, namely, the displacement amount d1, d2 at both end portions, is firstly formed, and then formed with the film thickness change section 7b according to the totally curved state as shown at (ii) and (iii) in FIG. 8B, so that the film thickness distribution may accord with the height difference Δh between each solder bump 16a, thereby transferring the paste. In such cases, the paste transfer pattern P2 (small curved pattern) and the paste transfer pattern P3 (large curved pattern) are set up, and stored and linked with the component kinds B and C in the component data storage section 133, respectively.

Further, the electronic component having small deformation in the central portion and local warp deformation only at both end portions, like the electronic component 16D as shown at (iv) in FIG. 8A, is formed with the film 7a having the overall film thickness t3 according to the displacement amount d3, and then formed with the film thickness change section 7b according to the deformation state, thereby transferring the paste, as shown at (iv) in FIG. 8B. In this case, the paste transfer pattern P4 (end portion increased thickness pattern) is set up and stored and linked with the component kind D in the component data storage section 133.

And the squeegee movement patterns S1, S2, S3, S4, . . . are generated, based on the paste transfer patterns P1, P2, P3, P4, . . . set up in the above manner. That is, the control data for controlling the squeegee 28 to form the film having the film thickness distribution represented in each of the above paste transfer patterns by driving the vertical drive mechanism 26 and the horizontal drive mechanism 27 is generated by the control section 130. These control data are stored and linked with the paste transfer patterns P1, P2, P3, P4, . . . in the squeegee movement data storage section 134.

To link each data in the paste transfer information library 132 in the above examples, the component warp information 133a and the paste transfer pattern 133b are linked with the component kind in the component data storage section 133, and the squeegee movement pattern 134a is linked with the paste transfer pattern 133b in the squeegee movement data storage section 134. However, a link method between each data may be arbitrary, whereby the squeegee movement pattern 134a may be directly linked with the component kind.

In this embodiment, the control section 130 controls the squeegee drive section 135, based on the recognition result of the electronic component by the recognition section 137 and the paste transfer information read from the paste transfer information library 132, to allow the squeegee 28 to perform the film formation operation, whereby the film 7a having the film thickness distribution for transferring the desired transfer a of solder paste 7 according to the state of warp deformation of the electronic component is formed on each of plural solder bumps 16a in the paste transfer unit 24, as described below.

Figure 14:
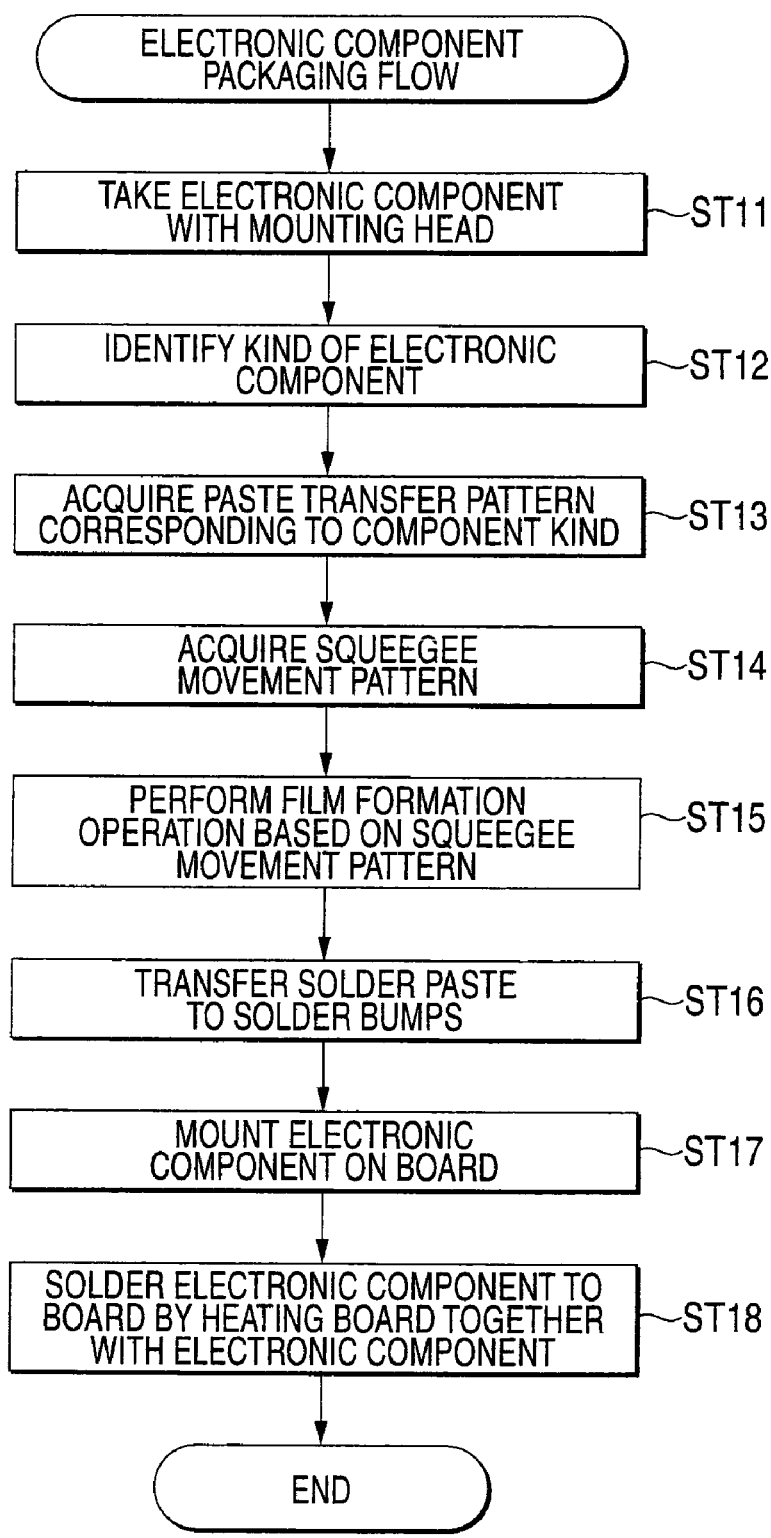
FIG. 14 is a flowchart showing an electronic component mounting method according to another embodiment of the invention.

Referring to a flowchart of FIG. 14, an electronic component mounting method for use in the electronic component mounting system will be described below. This electronic component mounting method involves placing the electronic component 16 with plural solder bumps 16a formed on the lower surface on the board 5, and mounting it. First of all, the electronic component 16 is taken out of the second component supply section 13B by the placing head 19 (ST11).

Next, the kind of electronic component is identified (ST12). That is, the image of the electronic camera 16 held on the placing head 19 is picked up by a component recognition camera 123 when it passes above the component recognition camera 123 in the movement path on which the placing head 19 is moved to the board 5. Further, a recognition section 137 makes the recognition process for the acquired image to identify the kind of electronic component 16. If the mounting sequence in the component mounting work is preset invariably and the kind of electronic component is specified in each mounting operation on the sequence program, the kind of electronic component specified here may be regarded as the identification result.

The controls section 130 acquires the paste transfer pattern corresponding to the component kind by reading the data from the component data storage section 133, based on the identification result (ST13). And the controls section 130 acquires the squeegee movement pattern corresponding to the paste transfer pattern by reading the data from the squeegee movement data storage section 134 (ST14). Then, the control section 130 controls the squeegee drive section 136 based on this squeegee movement pattern to allow the squeegee 28 to perform the film formation operation according to the paste transfer pattern (ST15). That is, in this film formation operation performed before the paste transfer process as described below, the control section 130 controls the squeegee drive section 136, based on the identification result of the electronic component 16 and the paste transfer information read from the paste transfer information library 132, so that the film 7a having the film thickness distribution for transferring the desired transfer amount of solder paste 7 according to the state of warp deformation of the electronic component is formed on each of the plural solder bumps 16a.

Next, the solder paste 7 is transferred to the solder bumps 16a by causing the electronic component 16 held in the placing head 19 to descend to the film formation face 25a of the paste transfer unit 24 (paste transfer process) (ST16), as shown in FIG. 9A. That is, the electronic component 16 held n the unit placing head 20 is caused to descend to the film 7a to make each solder bump 16a contact with the film 7a, as shown in FIG. 9B, so that the desired transfer amount of the solder paste 7 is transferred to each solder bump 16a of the electronic component 16, as shown in FIG. 9C.

Next, the electronic component 16 is placed on the board 5 (ST17). That is, the unit placing head 20 holding the electronic component 16 after transfer of the solder paste 7 is located above the board 5 by moving the placing head 19 to align the solder bumps 16a with the electrodes 5a of the board 5, as shown in FIG. 10A. Then, the electronic component 16 is caused to descend, and placed on the board 5 to cause the solder bumps 16a to land on the electrodes 5a of the board 5 via the solder paste 7, as shown in FIG. 10B (component placing process).

Thereafter, the board 5 with the electronic component 16 placed is carried into the reflow apparatus M4. And the board 5 is heated, together with the electronic component 16, up to the solder melting temperature or more, to melt the solder components in the solder bumps 16a and the solder paste 7 and join by soldering the electronic component 16 with the board 5, as shown in FIG. 10C (reflow process) (ST18). At this time, the electronic component 16 undergoes a thermal deformation, and has a deformation behavior that it is warped upward on the outer edge portion, whereby the solder bumps 16a located in the outer edge portion are displaced together with the electronic component 16 to increase the gap with the electrodes 5a.

Even in this case, the desired transfer amount of solder paste 7 is additionally transferred and supplied to each solder bump 16a, based on the component warp information of the electronic component 16, whereby the solder amount for soldering the solder bumps 16a and the electrodes 5a is less insufficient in the portion where the gap between the electrodes 5a and the solder bumps increase due to warp deformation. That is, the solder component in which the solder bumps 16a of the electronic component 16 is fused, integrally with the solder component in which the solder in the solder paste 7 is fused, normally connects all the solder bumps 16a with the electrodes 5a, whereby the solder joints 16b electrically connecting the electronic component 16 with the electrodes 5a are excellently formed without causing a cold joint such as a faulty electrical continuity or shortage of junction strength, as shown in FIG. 10C.

Thus, in the electronic component mounting method according to this embodiment, the desired transfer amount of solder paste 7 in accordance with the state of warp deformation of the electronic component is transferred to each of the plural solder bumps 16a, based on the paste transfer information stored for each kind of electronic component in the paste transfer information library 32, as previously described, whereby the solder paste 7 is just enough for each solder bump 16a in the reflow process. Thereby, it is possible to prevent the cold joint from occurring when the semiconductor package of thin type likely to cause warp deformation in the reflow process is mounted on the board by means of soldering.

INDUSTRIAL APPLICABILITY

The electronic component placing apparatus and the electronic component mounting method of the invention have the effect that it is possible to prevent the cold joint from occurring when the electronic component likely to cause warp deformation are mounted by means of soldering, and are effective for the field where the semiconductor package of thin type formed with the solder bumps is packaged on the board by means of soldering.

The invention claimed is:

1. An electronic component placing apparatus for placing an electronic component with a plurality of solder bumps formed on a lower surface on a board, comprising:

a component supply section for supplying said electronic component;

a board holding section for holding and positioning said board;

a placing head for taking the electronic component out of said component supply section and placing said electronic component on the board held in said board holding section;

head movement means for moving said placing head between said component supply section and the board holding section;

a component warp information storage section for storing the component warp information indicating a state of warp deformation in a reflow process of said electronic component;

a paste transfer unit, disposed on a movement path of said placing head, for transferring the solder paste to a plurality of solder bumps by forming a film of solder paste to be transferred to said solder bumps on a film formation face and causing the electronic component held in said placing head to descend to said film formation face; and a control section for controlling said paste transfer unit;

wherein said paste transfer unit has a squeegee, driven by a squeegee drive section, for performing a film formation operation of combining the horizontal movement and the vertical movement on said film formation face, said control section controls said squeegee drive section based on said component warp information to form the film having a film thickness distribution for transferring a desired transfer amount of solder paste according to said state of warp deformation in said electronic component to each of said plurality of solder bumps.

2. An electronic component placing apparatus for placing an electronic component with a plurality of solder bumps formed on a lower surface on a board, comprising:

a component supply section for supplying said electronic component;

a board holding section for holding and positioning said board;

a placing head for taking the electronic component out of said component supply section and placing said electronic component on the board held in said board holding section;

head movement means for moving said placing head between said component supply section and the board holding section;

a paste transfer unit, disposed on a movement path of said placing head, for transferring the solder paste to a plurality of solder bumps by forming a film of solder paste to be transferred to said solder bumps on a film formation face and causing the electronic component held in said placing head to descend to said film formation face;

a control section for controlling said paste transfer unit; and a paste transfer information library that stores, for each kind of electronic component, the paste transfer information including the component warp information indicating a state of warp deformation in a reflow process of said electronic component, a paste transfer pattern indicating a film thickness distribution for transferring a desired transfer amount of solder paste according to said state of warp deformation to said plurality of solder bumps, and the squeegee movement data for causing a squeegee to perform a film formation operation of combining the horizontal movement and the vertical movement on said film formation face in said paste transfer unit to implement said film thickness distribution;

wherein said control section controls a squeegee drive section for driving said squeegee to perform said film formation operation, based on the identification result of said electronic component and the paste transfer information read from said paste transfer information library, to form a film having a film thickness distribution for transferring a desired transfer amount of solder paste according to said state of warp deformation in said electronic component to each of said plurality of solder bumps in said paste transfer unit.

3. An electronic component mounting method for placing and mounting an electronic component with a plurality of solder bumps formed on a lower surface on a board for use in an electronic component placing apparatus comprising: a component supply section for supplying said electronic component; a board holding section for holding and positioning said board; a placing head for taking the electronic component out of said component supply section and placing said electronic component on the board held in said board holding section; head movement means for moving said placing head between said component supply section and the board holding section; a component warp information storage section for storing the component warp information indicating a state of warp deformation in a reflow process of said electronic component; a paste transfer unit, disposed on a movement path of said placing head, for forming a film of solder paste to be transferred to said solder bumps on a film formation face with a squeegee that performs a film formation operation of combining the horizontal movement and the vertical movement on said film formation face; and a control section for controlling said paste transfer unit;

the electronic component mounting method comprising:

a step of taking the electronic component out of said component supply section with the placing head;

a paste transfer step of transferring the solder paste to said solder bumps by causing the electronic component held in said placing head to descend to said film formation face in said paste transfer unit; and a component placing step of placing said electronic component on said board to cause said solder bumps to land via said solder paste on the electrodes of said board;

wherein film formation operation performed before said paste transfer step, said control section controls a squeegee drive section for driving said squeegee based on said component warp information to form the film having a film thickness distribution for transferring a desired transfer amount of solder paste according to said state of warp deformation in said electronic component to each of said plurality of solder bumps.

4. An electronic component mounting method for placing and mounting an electronic component with a plurality of solder bumps formed on the lower surface on a board for use in an electronic component placing apparatus comprising: a component supply section for supplying said electronic component; a board holding section for holding and positioning said board; a placing head for taking the electronic component out of said component supply section and placing said electronic component on the board held in said board holding section; head movement means for moving said placing head between said component supply section and the board holding section; a paste transfer unit, disposed on a movement path of said placing head, for forming a film of solder paste to be transferred to said solder bumps on a film formation face with a squeegee that performs a film formation operation of combining the horizontal movement and the vertical movement on said film formation face; and a control section for controlling said paste transfer unit; and a paste transfer information library that stores, for each kind of electronic component, the paste transfer information including the component warp information indicating a state of warp deformation in a reflow process of said electronic component, a paste transfer pattern indicating a film thickness distribution for transferring a desired transfer amount of solder paste according to said state of warp deformation to said plurality of solder bumps, and the squeegee movement data for causing the squeegee to perform the film formation operation of combining the horizontal movement and the vertical movement on said film formation face in said paste transfer unit to implement said film thickness distribution;

the electronic component mounting method comprising:

a step of taking the electronic component out of said component supply section with the placing head;

a paste transfer step of transferring the solder paste to said solder bumps by causing the electronic component held in said placing head to descend to said film formation face in said paste transfer unit; and a component placing step of placing said electronic component on said board to cause said solder bumps to land via said solder paste on the electrodes of said board;

wherein in said film formation operation performed before said paste transfer step, said control section controls a squeegee drive section for driving said squeegee based on the identification result of said electronic component and the paste transfer information read from said paste transfer information library to form the film having a film thickness distribution for transferring a desired transfer amount of solder paste according to said state of warp deformation in said electronic component to each of said plurality of solder bumps.

* * * * *